United States Patent [19]

Enochs

[11] Patent Number: 4,597,617
[45] Date of Patent: Jul. 1, 1986

[54] PRESSURE INTERCONNECT PACKAGE FOR INTEGRATED CIRCUITS

[75] Inventor: Raymond S. Enochs, Hillsboro, Oreg.

[73] Assignee: Tektronix, Inc., Beaverton, Oreg.

[21] Appl. No.: 591,348

[22] Filed: Mar. 19, 1984

[51] Int. Cl.[4] .............................................. H01R 23/72
[52] U.S. Cl. ................................ 339/17 CF; 339/174; 361/398
[58] Field of Search ............. 339/17 F, 17 CF, 17 M, 339/75 M, 75 MP, 174; 361/395, 398, 399, 400

[56] References Cited

U.S. PATENT DOCUMENTS

| | | | |
|---|---|---|---|
| 1,663,570 | 3/1928 | Senz | 220/297 |
| 3,825,801 | 7/1974 | Beavitt et al. | 339/17 F |
| 3,832,769 | 9/1974 | Olyphant, Jr. et al. | 361/398 |
| 3,967,162 | 6/1976 | Ceresa et al. | 361/398 |
| 3,991,463 | 11/1976 | Squitieri et al. | 339/DIG. 3 |
| 4,169,642 | 10/1979 | Mouissie | 361/398 |
| 4,360,858 | 11/1982 | Fahling | 361/398 |
| 4,390,220 | 7/1983 | Benasutti | 339/17 CF |

Primary Examiner—Neil Abrams
Attorney, Agent, or Firm—John D. Winkelman; John Smith-Hill; William O. Geny

[57] ABSTRACT

A pressure interconnect package for connecting an integrated circuit chip to an etched circuit board comprising a pressurized stack of circuit elements in which a flexible interconnecting circuit is disposed between the IC chip and the etched circuit board to cause them to make electrical contact upon the application of pressure to the stack.

12 Claims, 6 Drawing Figures

PRESSURE INTERCONNECT PACKAGE FOR INTEGRATED CIRCUITS

BACKGROUND OF THE INVENTION

The following invention relates to a method and apparatus for connecting an integrated circuit chip to an etched circuit board utilizing pressure contact without the need for soldering or wire bonding.

In any application in which an integrated circuit chip is used, electrical connection must be made between the various contact points on the chip and the remaining elements of the circuit or system in which the chip is used. Typically such electrical connections are made by either soldering the bond pads that normally occur on the chip to the etched circuit boards or other circuit elements or by wire bonding. Both processes are complex and uneconomical since each takes a considerable amount of time, and since integrated circuit chips, once in place according to either process, cannot be easily removed or replaced if defective.

In the past, sets of electrical conductors have been connected together by the use of pressure contact between a pair of etched circuit boards or between an etched circuit board and a flexible interconnecting circuit board. An example of such a device is shown in Reardon U.S. Pat. No. 4,125,310 issued Nov. 14, 1978. The device of the Reardon patent is an electrical connector comprising a pair of wafers having corresponding patterns of interlayed conductors which are pressed together to make an electrical connection. The Reardon patent, however, does not attempt to solve the problem of how to connect integrated circuits to an etched circuit board in a purely mechanical manner so that the integrated circuit may be removed or replaced without the necessity of soldering or bonding.

SUMMARY OF THE INVENTION

The present invention comprises a pressure interconnect package for connecting an integrated circuit chip to an etched circuit board in which a pressurizing plate, which may be twist locked onto a base, causes certain conductive portions in a stack of relatively flat elements aligned on the base to make electrical contact. Other elements in the stack serve to align the various contact points of the electrical elements so that proper contact is made when pressure is applied.

The package comprises a stack of circuit elements, retainer members, and pressure pads, some of which are bored to accommodate upwardly-extending alignment members connected to the base. The stack is threaded onto the alignment members and a top plate, which may also function as a heat sink, is threaded over the members on top of the stack and twist locked into place.

The input and output points on an integrated circuit comprise a series of contact pads or bond pads which are arranged in a pattern about the periphery of the IC chip. An etched circuit board of the type used in the invention comprises a flat layer of an epoxy-type material overlayed with conductors arranged in a pattern.

The physical interaction between the integrated circuit bond pads and the conductor pattern of the etched circuit board is made by means of a flexible interconnecting circuit or flex circuit which comprises a thin sheet of mylar or polyimide overlayed with a series of conductive strips. The flex circuit's conductive strips are arranged in a pattern generally matching that of the etched circuit board. The termination points of the conductive strips lie in a pattern matching the pattern of the contact pads or bond pads on the IC chip.

In order to provide means for the flex circuit to make electrical connection with the bond pads on the integrated circuit, very small diameter holes are drilled in the termination points of the conductive strips on the flex circuit. These holes may be drilled with the aid of a laser. The holes are then electroplated with conductive material, such as copper, until a post is built up inside the hole which extends through the polymide sheet and presents a contact point capable of contacting the bond pads on the IC chip.

The chip is held in its proper position by a retainer member which fits over a silicone pressure pad. The pressure pad also contacts the flex circuit and forces the conductive strips on the flex circuit to make contact with the etched circuit board. A second silicone pressure pad is inserted into a central bore in the etched circuit board pushing the conductive posts on the flex circuit upwards against the bond pads on the IC chip. The entire stack, once formed, is threaded onto the upwardly extending alignment members of the base and a substantially uniform pressure is applied which causes the silicone pressure pads to push against the respective contact members on the flex circuit and make electrical contact between the IC chip and the etched circuit board. This pressure is applied by connecting an upper top plate over the top of the stack which twist locks onto the alignment members. A certain amount of compression must be applied to the top plate in order that it may be twist locked. This compression forces the silicon pressure pads to press the various conductive elements together.

This top plate may also comprise fins for use as a heat sink. The heat sink is electrically isolated from the IC chip by an insulative membrane which lies against the non-patterned surface of the IC chip inside the IC retainer.

Since no soldering is involved in making the aforementioned connection, the IC chip may be replaced simply by unlocking the top plate and removing the IC chip from the retainer. Similarly, any defects in the flexible circuit member or in the etched circuit board may be cured by simply removing and replacing the defective piece.

All of the parts of the pressure package fit within a stack which is mechanically pressurized and locked with a simple twist locking mechanism thus obviating the need for soldering or bonding which would render assembly or disassembly costly and time consuming.

It is a principal object of this invention to provide a new or improved method and apparatus for making electrical connection between an integrated circuit chip and an etched circuit board.

It is an object of this invention to provide a method of making electrical connection between an integrated circuit chip and an etched circuit board without the need for wire bonding or soldering.

It is another object of this invention to provide an electrical interconnect package including an IC chip which may be easily assembled and disassembled.

Yet another object of this invention is to provide an electrical interconnection package including an integrated circuit chip utilizing only mechanical interconnection caused by pressurizing a stack of circuit elements having corresponding patterns of electrical contact points.

It is a further object of this invention to provide a mechanical pressure interconnect package for an integrated circuit which dissipates heat energy generated by the integrated circuit.

A still further object of this invention is to provide a mechanical pressure interconnect package for an integrated circuit comprising a stack of components which can be easily assembled and disassembled and which does not utilize any permanent type of bonding for mechanical or electrical interconnection.

The foregoing and other objectives, features and advantages of the present invention will be more readily understood upon consideration of the following detailed description of the invention taken in conjunction with the accompanying drawings.

DETAILED DESCRIPTION OF THE DRAWINGS

Figure 1:
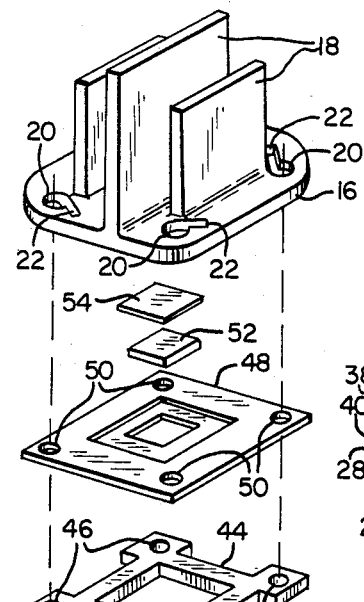
FIG. 1 is an exploded perspective view of the pressure interconnect package for an integrated circuit.

Referring now to the drawings, and particularly FIG. 1, a pressure interconnect package consists of a base 10 which may also function as a lower heat sink. Base 10 has a plurality of upwardly extending alignment members 12 in which each of the alignment members has a notch 14 adapted to form a twist lock connection with an upper top plate 16. Upper top plate 16 also functions as a heat sink and has a plurality of heat dissipating fins 18. Top plate 16 has bores 20 adapted to engage the upwardly extending alignment menbers 12. The bores are generally circular but have rectangular slots 22 so that when torque is applied upon attaching the top plate to the lower base the rectangular slots 22 engage notches 14 thereby locking the unit in place.

An etched circuit board 24 has a plurality of bores 26 for mating with upwardly extending alignment members 12. The circuit board is overlayed with a plurality of conductors 28 forming a pattern in its surface. The circuit board 24 also has a central aperture 30 for receiving a cylindrical silicone pressure pad 32. When the etched circuit board 24 is threaded onto alignment members 12 the pad 32 rests upon the upper surface of base 10.

On top of etched circuit board 24 is a flexible interconnecting circuit member or flex circuit 34 which has the same plurality of bores 36 as etched circuit board 24 and is likewise adapted to engage alignment members 12. The flex circuit 34 comprises a thin sheet of polyimide or mylar 38 overlayed with conductive strips 40 made of copper or other suitable conductive material. These conductive strips 40 are arranged in a pattern which matches at least a portion of the pattern of the conductor overlays 28 in circuit board 24. At the inner terminating end of each of the conductive strips 40 there is a pattern of posts 42 which extend through the thin mylar or polyimide film 38. Posts 42 are extremely small and can be formed by laser drilling polyimide material 38 at the terminating ends of each of conductors 40, and then electroplating the holes formed by the drilling with conductive material. Typically the dimensions of such posts are extremely small, having a diameter of 0.005 inches and a height of 0.003 inches. Typically, the thin film 38 has a thickness of 0.002 inches so that the posts 42 extend above the film 38 by about 0.001 inch.

Overlayed on top of flex circuit 34 is a silicone pressure pad 44 which also has bores 46 adapted to fit members 12. On top of silicone pressure pad 44 is a nonconductive retainer 48 having bores 50 which also engage members 12. Retainer 48 holds an integrated circuit chip 52 in a predetermined position relative to the pattern of posts 42 on flex circuit 34. This position is chosen so that the pattern of bond pads or contact pads (not shown) on IC chip 52 matches the pattern of posts 42 on flex circuit 34. An insulative membrane 54 may be placed on top of IC chip 52. Top plate 16 may be constructed of metal enabling it to function as a heat sink when the entire package is assembled.

Figure 2:
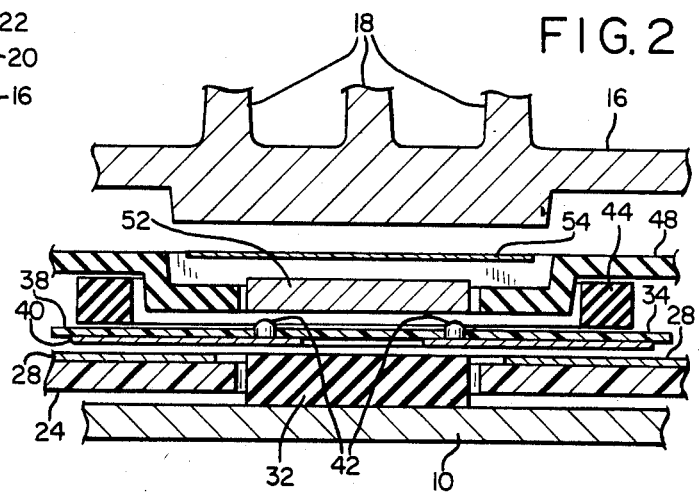
FIG. 2 is a partial side cutaway exploded view of the pressure interconnect package of FIG. 1.
Figure 3:
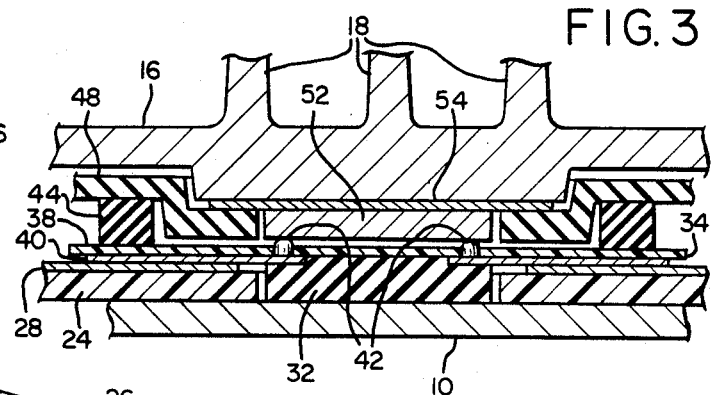
FIG. 3 is a partial side cutaway view of the pressure interconnect package of FIG. 2 after compression by the top plate.
Figure 1A:
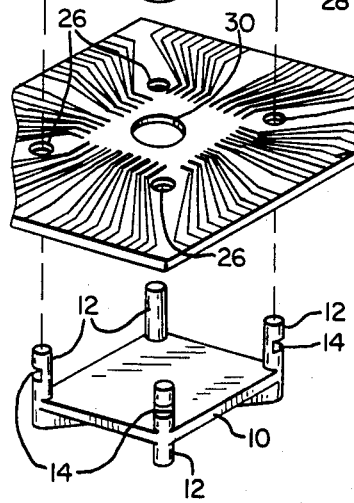
FIG. 1A is a perspective view of the opposite side of the flexible interconnecting circuit member shown in FIG. 1.
Figure 1A:
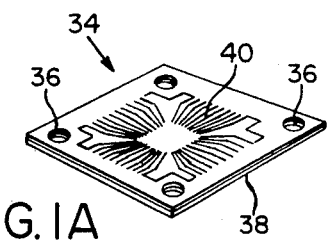
Figure 4:
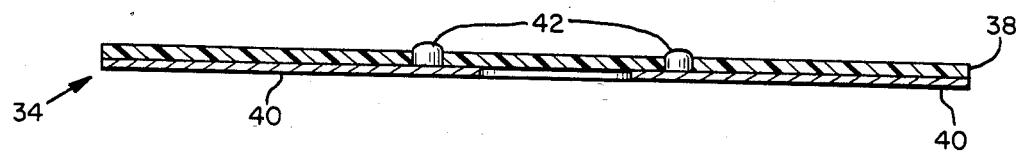
FIG. 4 is a partial side cutaway view of a flexible interconnecting circuit used in conjunction with the pressure interconnect package of FIG. 1.

The package is constructed by forming a stack, as shown in FIGS. 1 and 2, threading the stack onto the alignment members 12, covering the stack with the top plate 16, and twisting the top plate into locking position by twisting slots 22 into engagement with notches 14. As shown in FIG. 3, when the stack is compressed, silicone pressure pad 32 will force posts 42 upwardly against IC circuit chip 52 causing the posts to come into contact with the bond pads. IC chip 52 is inserted into retainer 48 which will hold it in a predetermined position so that the bond pad pattern matches the pattern formed by posts 42. Also, upon compression by top plate 16, silicone pressure pad 44 will force conductive strips 40 on flex circuit member 34 against conductors 28 on the surface of the etched circuit board 24. Thus, through the medium of flex circuit 34 the bond pad pattern on the IC chip 52 is brought into electrical contact with etched circuit board 24. This is accomplished solely through pressure induced contact, and as such, any component in the assembled package may be replaced if necessary by simply unlocking and removing top plate 16 and the intervening parts.

ALTERNATIVE EMBODIMENT

Figure 5:
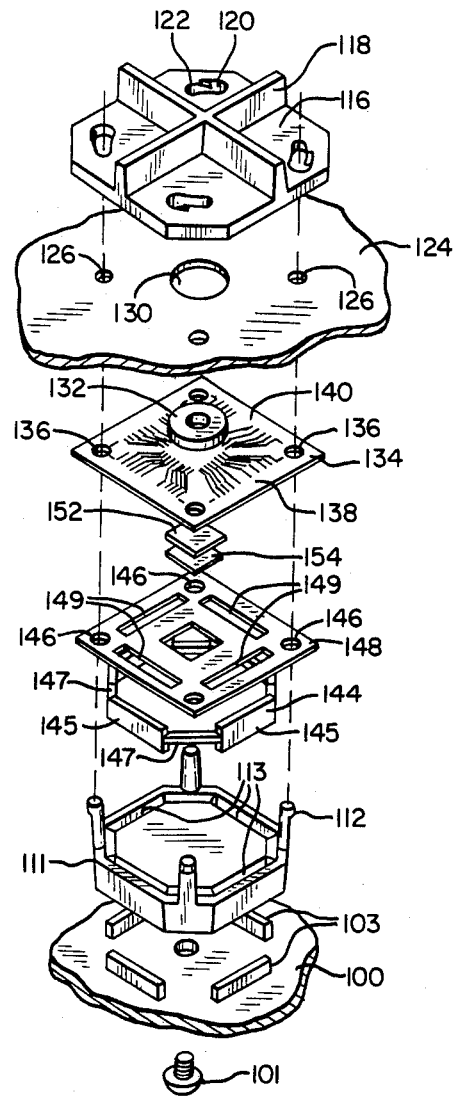
FIG. 5 is an exploded perspective view of an alternative embodiment of a pressure interconnect package for an integrated circuit.

FIG. 5 shows an alternative embodiment of the pressure interconnect package illustrated in FIGS. 1-3. In this embodiment the positions of the etched circuit board and the integrated circuit chip are reversed. In FIG. 5 a base 100 is affixed to the chassis of an electronic device (not shown) by a bolt 101. The base has a plurality of supports 103 which hold an octagonal lower heat sink 111 in position. The lower heat sink 111 has a plurality of upwardly extending alignment members 112, and a plurality of inwardly positioned recesses 113 adapted to receive a silicone pressure pad 144. The pressure pad 144 has an octagonal shape to conform to the shape of the lower heat sink 111. Four sides of the silicone pressure pad 144 comprise four upwardly extending pad members 145. These are connected by four separator members 147. The pad members extend upwardly through slots 149 in retainer 148. Retainer 148 also has a plurality of bores 146 adapted to fit over the upwardly extending alignment members 112. A square aperture in the middle of retainer 148 holds IC chip 152. An insulating membrane 154 prevents the IC chip 152 from making electrical contact with the lower heat sink 111. A flex circuit 134 having a plurality of bores 136 fits on top of intergrated circuit chip 152 and has a plurality of conductive strips 140 which terminate in a pattern adapted to make contact with contact pads on IC chip 152. Electrical contact is insured by a small annular shaped silicone pressure pad 132 which rests on top of flex circuit 134 near the termination point of the conductive strips 140. An etched circuit board 124 having a plurality of bores 126 fits over the top of flex circuit 134 and has a pattern of conductors (not shown) adapted to engage the outer portion of the pattern of conductive strips 140 on flex circuit 134 upon the application of mechanical pressure as aided by silicone pressure pad 144. The etched circuit board 124 has a circular aperture 130 adapted to receive silicone pressure pad 132. Pressure is supplied by a top plate 116 which also functions as upper heat sink and as such has fins 118 for dissipating heat energy and for ease of handling. The top plate 116 has bores 120 and adjacent retangular slots 122. The bores engage the upwardly extending alignment members 112 and upon a twisting motion, the slots 122 engage the alignment members thereby locking the entire package in place.

The pressure from the top plate 116 compresses the silicone pads 132 and 144 forcing respective portions of the flex circuit 134 to make electrical contact both with the etched circuit board 124 and the IC chip 152. The flex circuit is bendable and deformable in the vertical plane and therefore can accommodate the differential pressure created by the oppositely disposed pressure pads 132 and 144.

The terms and expressions which have been employed in the foregoing specification are used therein as terms of description and not of limitation, and there is not intention, in the use of such terms and expressions, of excluding equivalents of the features shown and described or portions thereof, it being recognized that the scope of the invention is defined and limited only by the claims which follow.

I claim:

1. An apparatus for making an electrical connection between an integrated circuit chip having a plurality of contact pads arranged in a first pattern and an etched circuit board having a plurality of conductors arranged in a second pattern, comprising:
   (a) interconnecting circuit means having a plurality of conductive strips arranged to correspond to at least a portion of said second pattern, said strips terminating in contact points corresponding to at least a portion of said first pattern.
   (b) means for aligning said integrated circuit chip with said interconnecting circuit means and said etched circuit board with said interconnecting circuit means; and
   (c) means for applying substantially uniform pressure to said interconnecting circuit means, said integrated circuit chip, and said circuit board, thereby forcing said contact pads into electrical contact with said contact points and said conductive strips into electrical contact with said conductors without creating a direct physical bond between said contact pads and said contact points or between said conductive strips and said conductors, the pressure-applying means comprising a base member and a top member for receiving the circuit board, the integrated circuit chip and the interconnecting circuit means therebetween, with the interconnecting circuit means disposed between the circuit board and the integrated circuit chip, and the pressure-applying means further comprises means for locking the top member to the base member, a first resiliently compressible member positionable effectively between the circuit board and the interconnecting circuit means, and a second resiliently compressible member positionable effectively between the top member and the interconnecting circuit means, whereby upon locking of the top member to the base member the first and second resiliently compressible members are compressed and the first resiliently compressible member forces said contact pads into electrical contact with said contact points and the second resiliently compressible member forces said conductive strips into electrical contact with said conductors.

2. The apparatus of claim 1 wherein said interconnecting circuit means comprises a sheet of non-conductive material overlayed with said conductive strips.

3. The apparatus of claim 2 wherein said contact points comprise posts extending through said nonconductive material.

4. The apparatus of claim 3, wherein said alignment means comprise a plurality of alignment members supported by the base member.

5. The apparatus of claim 4, wherein the top member comprises a plate having apertures for engaging the alignment members, and the means for locking the top member to the base member comprise means for locking said plate to the alignment members.

6. The apparatus of claim 1, wherein said interconnecting circuit means comprises a sheet of non-conductive material having two main faces, said sheet being overlaid with said conductive strips on one main face, and wherein the contact points comprise posts extending through said non-conductive material and exposed at the other main face of the sheet.

7. The apparatus of claim 6, wherein said pressure-applying means includes a retainer defining an aperture for receiving the integrated circuit chip, and said second resiliently compressible member comprises a frame-like member that defines an opening that is larger than the aperture in the retainer, said frame-like member being positionable between the retainer and the interconnecting circuit means in a location such that the aperture defined by the retainer lies entirely within the opening defined by the frame-like member.

8. In combination, an integrated circuit chip having plurality of contact pads arranged in a first pattern, an etched circuit board having a plurality of conductors arranged in a second pattern, and a pressure interconnect package that establishes electrical contact between said contact pads and said conductors without creating a direct physical bond to said pads or said conductors, said package comprising:
   (a) a sheet of non-conductive material having a plurality of conductive strips that correspond in position to at least a portion of said second pattern and that terminate in contact points that correspond in position to at least a portion of said first pattern;
   (b) means for aligning the sheet of dielectric material relative to the integrated circut chip and the etched circuit board with the conductive strips in contact with the conductors of the etched circuit board and with the contact points in contact with the contact pads of the integrated circuit chip;

(c) a base member and a top member for receiving the sheet of non-conductive material, the integrated circuit chip and the etched circuit board therebetween;

(d) means for maintaining the base member and the top member at a fixed distance apart;

(e) a first resiliently compressible member effectively engaging the base member, the sheet and the integrated circuit chip being interposed between said first resiliently compressible member and the top member; and (f) a second resiliently compressible member effectively engaging the top member, the sheet of non-conductive material and the etched circuit board being interposed between said second resiliently compressible member and the base member.

9. A combination according to claim 8, wherein said sheet of non-conductive material has two main faces and is overlaid on one main face with said conductive strips, said contact points comprising posts extending through said non-conductive material and being exposed at the other of said main faces of the sheet.

10. A combination according to claim 8, wherein said sheet of non-conductive material has two main faces, said conductive strips being disposed at one of said main faces and said contact points being disposed at the other of said main faces.

11. A combination according to claim 10, comprising a retainer that defines an aperture in which the integrated circuit chip is disposed, and wherein the etched circuit board is formed with an aperture that substantially registers with the aperture of the retainer, said first resiliently compressible member comprising a pad that is disposed in the aperture of the circuit board and applies pressure to said one main face of the sheet of non-conductive material.

12. A combination according to claim 11, wherein said second resiliently compressible member comprises a frame-like member defining an opening that is larger than the aperture of the retainer, said frame-like member being disposed between the retainer and the sheet of non-conductive material in a position such that it surrounds the aperture of the retainer and engages said other main face of the sheet of non-conductive material and causes said one main face of the sheet of non-conductive material to be pressed against the circuit board.

* * * * *